(12) United States Patent
Rolandi

(10) Patent No.: US 6,466,479 B2
(45) Date of Patent: Oct. 15, 2002

(54) NON-VOLATILE MEMORY MATRIX ARCHITECTURE WITH VERTICAL INSULATION STRIPS BETWEEN ADJACENT MEMORY BLOCKS

(75) Inventor: Paolo Rolandi, Voghera (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/898,744

(22) Filed: Jul. 3, 2001

(65) Prior Publication Data

US 2002/0021582 A1 Feb. 21, 2002

(30) Foreign Application Priority Data

Jul. 4, 2000 (EP) ............................................. 00830468
Dec. 14, 2000 (EP) ............................................. 00204838

(51) Int. Cl.[7] .............................................. G11C 16/04
(52) U.S. Cl. .............................. 365/185.11; 365/185.16; 365/185.2
(58) Field of Search ....................... 365/185.01, 185.11, 365/185.16, 185.27, 185.2, 230.03, 230.06

(56) References Cited

U.S. PATENT DOCUMENTS

| | | | |
|---|---|---|---|
| 5,200,350 A | 4/1993 | Gill et al. ...................... 437/43 |
| 5,646,886 A | * 7/1997 | Brahmbhatt ............ 365/185.16 |
| 5,659,550 A | * 8/1997 | Mehrotra et al. .......... 371/21.4 |
| 5,691,938 A | * 11/1997 | Yiu et al. ............... 365/185.11 |
| 5,748,535 A | * 5/1998 | Lin et al. ................ 365/185.22 |
| 5,787,039 A | * 7/1998 | Chen et al. .................. 365/185 |
| 6,040,234 A | 3/2000 | Hisamune .................... 438/439 |

FOREIGN PATENT DOCUMENTS

| | | | |
|---|---|---|---|
| EP | 0552531 | 7/1993 | ......... H01L/27/115 |
| EP | 0854514 | 7/1998 | ......... H01L/27/115 |
| WO | 96/08840 | 3/1996 | ......... H01L/21/265 |

\* cited by examiner

*Primary Examiner*—David Nelms
*Assistant Examiner*—Thong Le
(74) *Attorney, Agent, or Firm*—Lisa K. Jorgenson; Allen, Dyer, Doppelt, Milbrath & Gilchrist, P.A.

(57) ABSTRACT

A non-volatile memory matrix architecture, having a virtual ground monolithically integrated on a semiconductor substrate, includes a plurality of memory cells organized into matrix blocks. The matrix blocks are placed on rows and columns and are associated with respective row and column decoding circuits. The memory blocks are separated from each other by at least one insulation stripe which is parallel to the columns. The non-volatile memory matrix architecture further includes a pass-transistor decoding circuit with a number of levels corresponding to the number of rows to select.

36 Claims, 5 Drawing Sheets

NON-VOLATILE MEMORY MATRIX ARCHITECTURE WITH VERTICAL INSULATION STRIPS BETWEEN ADJACENT MEMORY BLOCKS

FIELD OF THE INVENTION

The present invention relates to a non-volatile memory matrix, particularly of the EPROM type. Specifically, the present invention relates to a non-volatile memory matrix architecture having a virtual ground monolithically integrated on semiconductor, and includes a plurality of memory cells organized into matrix blocks or sectors, which are placed on rows and columns associated with respective row and column decoding circuits. The present invention also relates to a memory matrix having a small number of contacts.

BACKGROUND OF THE INVENTION

EPROM or Flash EPROM electronic memory devices integrated on a semiconductor material include a plurality of non-volatile memory cells organized into matrices. That is, the memory cells are organized into rows called word lines, and columns called bit lines.

Each non-volatile memory cell comprises a MOS transistor, in which the gate electrode placed over the channel region is floating. The gate electrode has a high D.C. impedance towards all the other terminals of the same cell and of the circuit in which the cell is inserted. The cell also comprises a second electrode, called a control gate electrode, which is driven by suitable driving voltage. The other transistor electrodes are the drain and source terminals.

The most recent developments in the field of non-volatile memories, particularly EPROM and FLASH memories, are directed to the increase of the storage capacity due to process architectures and/or innovative designs. In some cases old ideas, abandoned in the past because of technological immaturity, are re-proposed.

A first known approach used to increase the memory capacity of a memory matrix makes use of the so called multilevel cells, which can store several memory stages. Although this first approach is advantageous from different points of view, it has some drawbacks. In fact, the multilevel technique is quite elaborate and requires a particular architecture.

A second known approach is to use memory matrices having an architecture of the virtual ground type, that is, matrices of the contactless type. In this type of matrix technology the field oxide layer is not present in the matrix active area where the memory cells are formed. An example of this type of matrix is described in the U.S. Pat. No. 5,204,835. Although achieving its objective, not even this approach is without drawbacks. In fact, it is necessary to introduce selection transistors to correctly read cell groups belonging to the same row. Such transistors occupy a relevant portion of the available area on the integrated circuit.

SUMMARY OF THE INVENTION

An object of the present invention is to form a non-volatile memory matrix architecture for electronic memory devices integrated on semiconductor, and particularly, a virtual ground matrix, having structural and functional features which allows for a very high density and for obtaining circuit dimensions smaller than the devices formed according to the prior art.

This and other objects, features and advantages in accordance with the present invention are obtained by eliminating memory cell selection transistors, and by obtaining an insulation among the matrix column blocks due to insulation stripes which allow the use of traditional methods for the row and column decoding.

In particular, the non-volatile memory matrix architecture comprises a semiconductor substrate comprising a virtual ground monolithically integrated thereon, and row and column decoding circuits on the semiconductor substrate. A plurality of memory cells may be on the semiconductor substrate organized into matrix blocks placed on rows and columns of the row and column decoding circuits. Each memory cell may comprise a transistor comprising a source region and a drain region that are interchangeable. The non-volatile memory matrix architecture may further include at least one insulation stripe on the semiconductor substrate between adjacent matrix blocks, and the at least one insulation stripe is parallel to the columns.

BRIEF DESCRIPTION OF THE DRAWINGS

The features and the advantages of the device according to the present invention will be apparent in the following description, of an embodiment thereof, given by way of a non-limiting example with reference to the accompanying drawings.

DETAILED DESCRIPTION OF THE PREFERRED EMBODIMENTS

Figure 1:
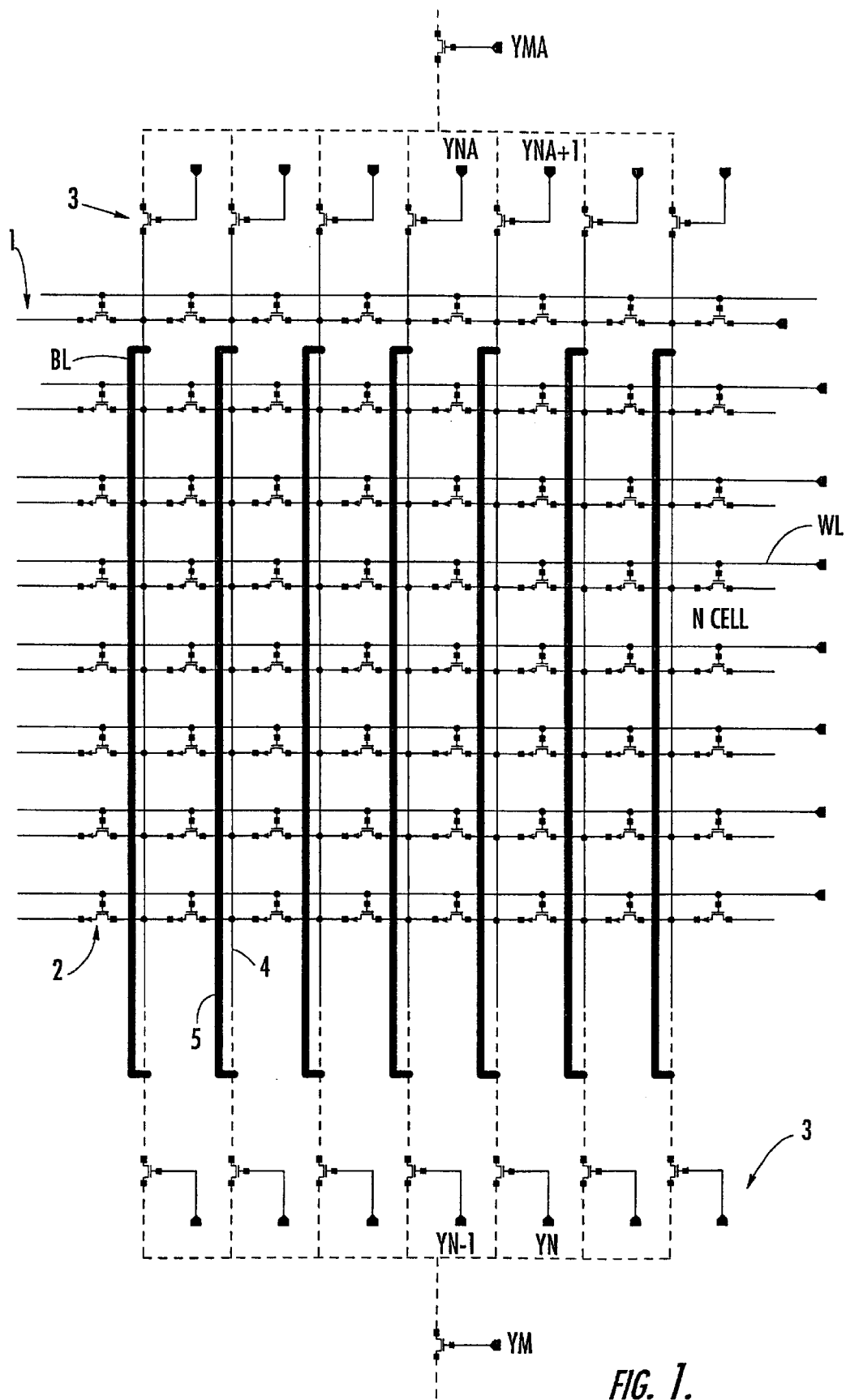
FIG. 1 is a schematic diagram of a memory matrix block forming an EPROM or a FLASH-EPROM device in accordance with the present invention.

With reference to the above figures, a portion of a non-volatile memory matrix portion formed according to the present invention is indicated at 1. The memory portion 1 of FIG. 1 is substantially a block or a sector of memory cells 2 organized into columns called bit lines BL and into rows called word lines WL. This is according to a traditional structure so that the cells are selected by standard decoding circuits.

A plurality of memory cells 2 and a plurality of decoding devices 3 are present in block 1. In detail, floating gate MOS devices form single memory cells 2, and MOS devices 3 perform the decoding function of the single memory cells 2.

In one embodiment, the architecture is of the NOR type. Such an architecture has a matrix area smaller than the one obtained with an architecture of the NAND type. In particular, every single non-volatile memory cell 2 comprises a MOS transistor, wherein the gate region placed over the channel region is floating. That is, the gate region presents a high D.C. impedance towards all the other terminals of the same memory cell and of the circuit in which the cell is inserted.

The memory cell 2 also comprises a second region called a control gate region, which is driven by a suitable driving voltage. The other transistor electrodes are the usual drain and source terminals. According to a prior art approach, the floating gate and control gate regions are formed with respective polysilicon layers, which are insulated from one another by a dielectric layer.

The control gate regions of memory cells belonging to the same row are connected to each other through a conduction word line WL. The adjacent memory cells 2 belonging to the same row share the same source or drain region 4. The source and drain regions 4 of the memory cells 2 are formed by diffusions in active areas and are alternatively used as source and drain regions, as it is hereafter described. Furthermore, the source and drain regions 4 are in contact with a metal line 5, which forms the bit line BL, for example, every 16 word lines.

Figure 6:
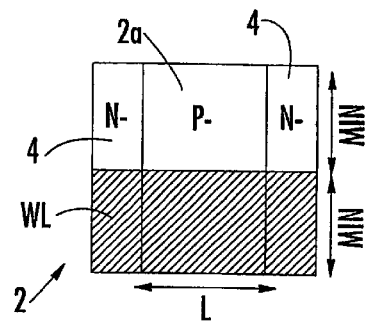
FIG. 6 is a diagram of one possible layout of a matrix memory cell in accordance with the present invention.

In FIG. 6 one possible layout of a memory cell 2 is shown. On a substrate 2a of P-type material, for example, source and drain regions 4 are formed through, for example, an N+ type implantation into the substrate. The control gate region is also shown. Such a region is formed by a polysilicon stripe, which is also used to form the word lines. As shown in FIG. 1, the decoding MOS devices 3 comprises a Yn transistor connected with each matrix column. The Yn transistors are therefore connected with a Ym pass transistor depending on the number of the matrix outputs. Also, a second Yna transistor is connected with each matrix column. The Yna transistors are therefore connected with a second Yma pass transistor.

Figure 2:
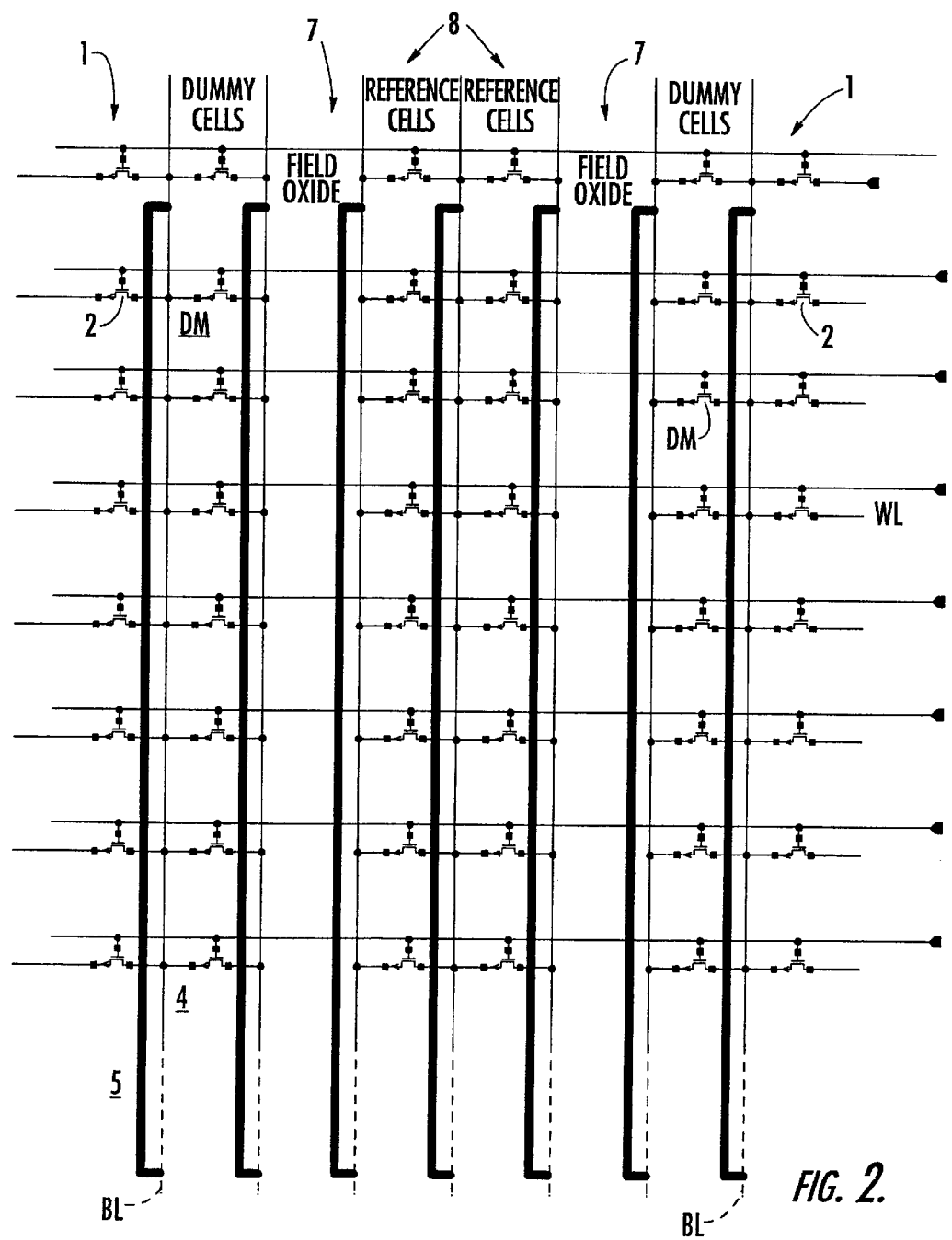
FIG. 2 is a schematic diagram of two memory matrix blocks including an interface therebetween in accordance with the present invention.

According to the present invention, the complete memory matrix includes a plurality of blocks 1. The blocks 1 are divided by at least an insulation layer 7, as shown in FIG. 2. Advantageously, this insulation layer 7 is a field oxide layer, which is formed between a block and the adjacent one. Consequently, cells belonging to adjacent blocks are avoided being in series with one another. In this embodiment, it is possible to avoid the introduction of selection transistors, which would be otherwise necessary to identify a memory cell.

Advantageously, in FIG. 2 a preferred embodiment is shown. In fact, between the two memory cell blocks two insulation stripes 7 are arranged, and reference cells 8 are inserted between the two stripes 7. Advantageously, the memory blocks 1 are delimited by non-used cell columns, called DUMMY columns.

The method used to select a memory cell 2 will now be described in accordance with the present invention. Particularly, the selection of an nth cell 2 is obtained by simultaneously connecting the nth bit-line to the circuitry 3 of the column decoding, and therefore to the reading circuitry, as in the prior art by short-circuiting to ground the 1-nth bit line.

The bit line n becomes the drain region of the selected cell 2, while the bit line n−1 becomes the source region of the same cell. As discussed above, the word lines WL are formed in polysilicon and are horizontally placed at a distance equal to the lithographic minimum, with a length equal to the lithographic minimum (min) as shown in FIG. 6. In this figure, L also indicates the length of the cell 2.

The bit lines BL, which are formed through the metal line 5, are vertically placed and are in contact with the active area which is below each n lines, for example 16 word lines. Also, the below active area is vertically placed, without continuity, along the whole array and forms the cell source or drain regions depending on the bias voltages.

Advantageously, the bit lines BL have been made out of metal and operate as a conductive shunt of the active area layer, therefore improving the resistivety of such layers. The vertical stripes of an active area have dimensions equal to the lithographic minimum, and the distance is determined by the desired features of the non-volatile memory cell. The stripes operate as a source or a drain of the selected cells.

The matrix decoding method will now be described according to the present invention. The nth cell indicated in FIG. 1 will be considered as an example. The cell comprises a drain, formed by the Yn bit line, and a source formed by the Yn-1 bit line.

The cell selection is made when two decoding levels are used, for example, by enabling a Ym pass transistor of the Yn bit line through the traditional decoding with the Yn signal, and by short-circuiting the Yn-1 bit line through another Yna transistor which is connected to the second Yma pass transistor, the latter of which is connected to ground.

The Yna transistors and the second Yma pass transistor are placed in the bit line area opposite to the column decoding, with the gate region connected to the Yn signal, which is the same signal used in the column decoder. Thus, by partially repeating the column decoding, the simultaneous selection of the drains and the connection to ground of the cell source are obtained.

According to the present invention, a particular row decoding circuit 10 has been advantageously provided. Such circuitry will be now be described with reference to a more general decoding case presenting three levels.

To improve the understanding of the peculiarities of this innovative decoding circuit 10, the technologies in the non-volatile EPROM, ROM and FLASH memory sector employ lithographs at 0.18 um. Also, the row and/or column decoding circuit planning becomes more and more complex because the difference of the area amount between the memory cells and the peripheral transistors is greater and greater.

To effectively use such high lithographic resolutions without resorting to additional metallization layers or an exceeding area increase of the decoders, a row decoding architecture with N-channel transistors which have the only role of pass-transistors is used.

Figure 3:
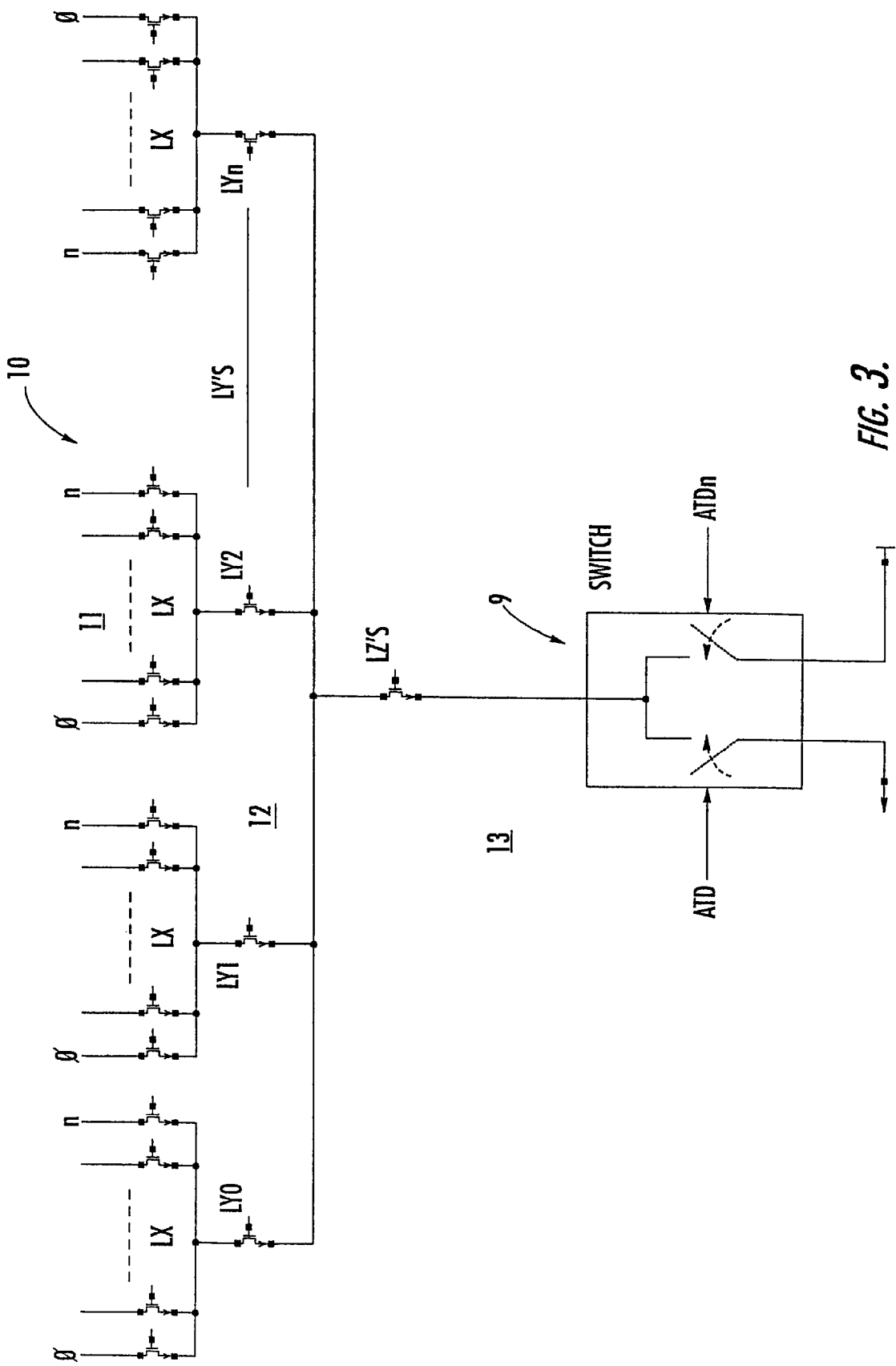
FIG. 3 is a schematic diagram of a decoding circuit associated with the memory matrix block illustrated in FIG. 1.

As an example, three decoding levels 11, 12 and 13 are shown in the structure of FIG. 3. A higher or a lower number of levels may also be provided, which substantially depends on the number of rows to select.

A switch 9 may be further provided, which is associated with the decoding circuitry 10. The switch 9 is driven by the ATD (Address Transition Detection) signal, which is always present in a non-volatile memory, and by the complement ATDn of this signal.

The decoding circuitry 10 comprises N-channel transistors driven on each level by respective Lx, Ly, Lz decoding signals, which have to be suitably boosted with regards to the Vdd supply during the reading operation so that the transfer of the total supply to the selected row is allowed.

The proposed decoding can be formed with only a metallization level and can be particularly used in submicron technologies. Every time that a commutation in the access addresses to the memory occurs, an ATD pulse is generated. The ATD pulse is normally used to also synchronize many operations within the memory device. According to the invention, the ATD signal is also applied to the switch 9 to connect it to ground.

Figure 4:
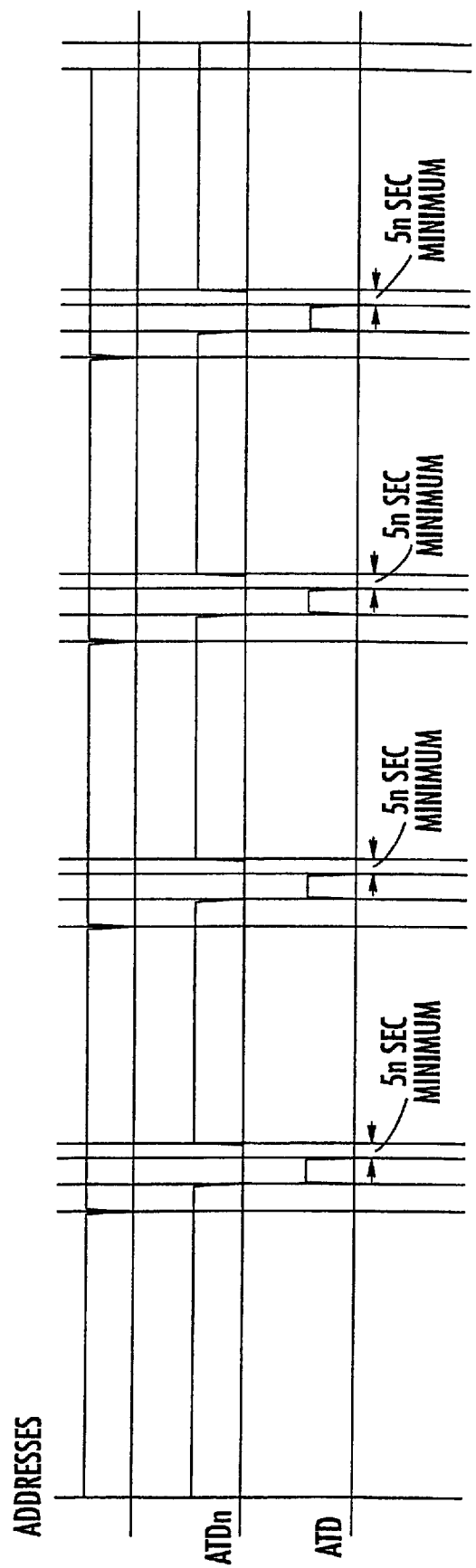
FIG. 4 is a diagram illustrating a function of the time an ATD signal is present in the memory matrix block illustrated in FIG. 1.

During the duration of the ATD pulse, the ground potential is applied on all the word lines by the respective decoding levels 11, 12, 13 through the Lx, Ly, Lz signals. The ATDn complement signal forces the switch 9 to switch to the Vdd supply. The switching time duration is schematically shown in FIG. 4.

In these operative conditions the supply potential is therefore applied to the word line, by means of the respective decoding levels 11, 12, 13, and the Lx, Ly, Lz signals. The supply of the Lx, Ly, Lz signals is provided by a charge pump, not shown since it is conventional, which allows a total driving of the pass-transistors to the considered Vdd voltage.

Figure 5:
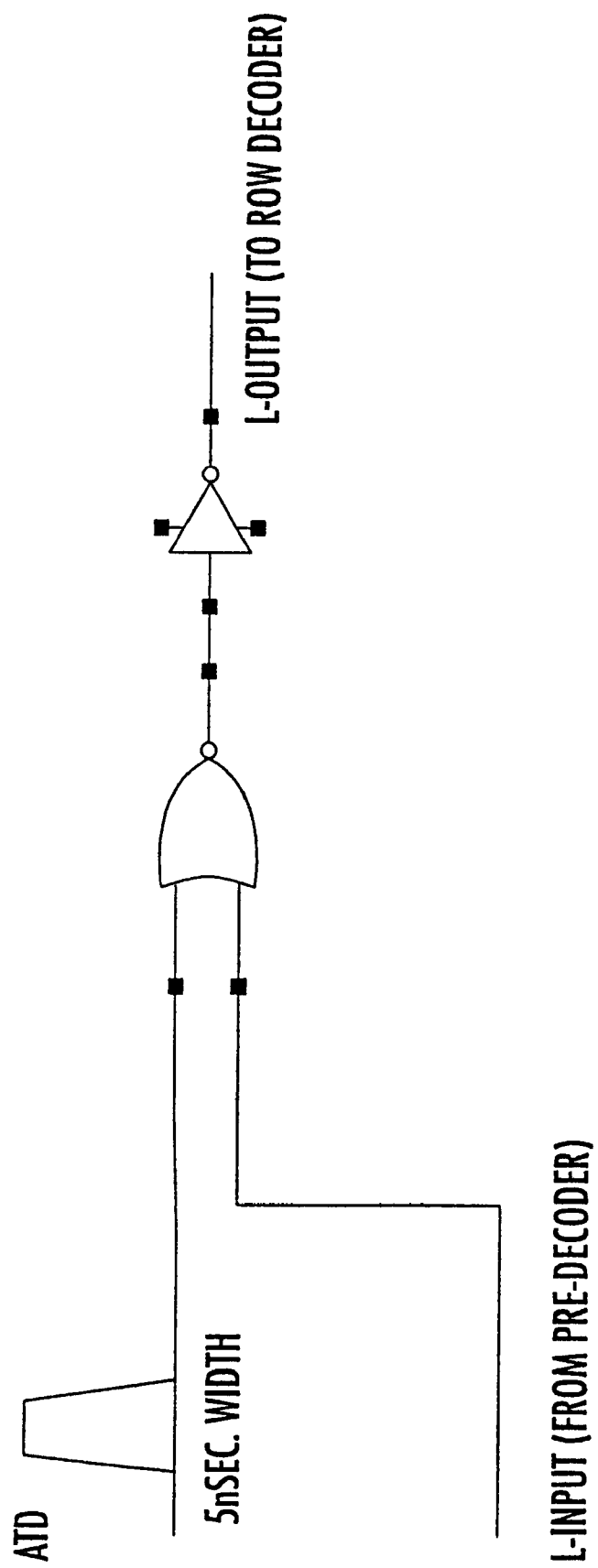
FIG. 5 is a more detailed schematic diagram of a portion of the decoding circuit illustrated in FIG. 3.

Each of the decoding signals of the "L" type is obtained by a pair of series connected logic gates. As an example, a circuit structure comprising a NOR gate 14 having two inputs and to which an inverter 15 is cascade connected is shown in FIG. 5. A first input of the NOR gate 14 receives the ATD signal, while the other input receives an L signal from a pre-decoder, which is not shown since it is also conventional. The output of this series of logic gates 14, 15 is applied to a respective transistor of the row decoding.

The memory matrix according to the invention allows formation of a very compact matrix while avoiding the use of the selection transistors, and introduces insulation stripes between the memory blocks, with a reduction of the total space. The selection of the single memory cells occurs in a relative straightforward and effective way, due to a pass-transistor decoding circuitry.

The architecture according to the present invention leads to a considerable efficiency gain of the memory cells, since the metal line 5 contacts the source and drain regions every 16 word lines. In the prior art the selection transistors are placed every 64 word lines, with a clear decay in the performance of the memory cells.

The performances of the memory cells are also improved due to the features of the source and drain regions of the cell being interchangeable with each other. Furthermore, the source and drain region resistance of the memory cell is advantageously the same.

That which is claimed is:

1. A non-volatile memory matrix architecture comprising:
   a semiconductor substrate comprising a virtual ground monolithically integrated thereon;
   row and column decoding circuits on said semiconductor substrate;
   a plurality of memory cells on said semiconductor substrate organized into matrix blocks placed on rows and columns of said row and column decoding circuits, each memory cell comprising a transistor comprising a source region and a drain region that are interchangeable; and
   at least one insulation stripe on sail semiconductor substrate between adjacent matrix blocks, and said at least one insulation stripe being parallel to the columns.

2. A non-volatile memory matrix architecture according to claim 1, wherein said at least one insulation stripe comprises two insulation stripes in reciprocal spaced relation.

3. A non-volatile memory matrix architecture according to claim 2, further comprising a plurality of reference cells between said two insulation stripes.

4. A non-volatile memory matrix architecture according to claim 1, wherein said at least one insulation stripe comprises silicon oxide.

5. A non-volatile memory matrix architecture according to claim 1, wherein said plurality of memory cells are configured so that the memory matrix architecture comprises a NOR-type architecture.

6. A non-volatile memory matrix architecture according to claim 1, further comprising a row decoding circuit having a number of levels based upon a number of rows to select.

7. A non-volatile memory matrix architecture according to claim 6, wherein said row decoding circuit further comprises a selection switch being driven by an ATD signal associated with said row decoding circuit.

8. A non-volatile memory matrix architecture according to claim 6, wherein said row decoding circuit comprises a plurality of N-channel pass-transistors which are driven on each level by respective signals derived from an ATD signal.

9. A non-volatile memory matrix architecture according to claim 8, further comprising a cascade connected logic circuit, and wherein the respective signals are obtained by the ATD signal downstream of said cascade connected logic circuit.

10. A non-volatile memory matrix architecture according to claim 1, further comprising at least one selection pass-transistor, and wherein each column of said plurality of memory cells is head of a selection pass-transistor, and the columns of each matrix block are head of a pass-transistor for selecting a memory block.

11. A non-volatile memory matrix architecture according to claim 1, wherein columns of said plurality of memory cells comprises a conductive stripe in contact with said source or drain regions every 16 rows.

12. A non-volatile memory comprising:
    a semiconductor substrate;
    row and column decoding circuits on said semiconductor substrate;
    a plurality of memory cells on said semiconductor substrate organized into matrix blocks placed on rows and columns of said row and column decoding circuits, each memory cell comprising a transistor comprising a source region and a drain region; and
    at least one insulation stripe on said semiconductor substrate between adjacent matrix blocks, and said at least one insulation stripe being parallel to the columns.

13. A non-volatile memory according to claim 12, wherein said semiconductor substrate comprises a virtual ground monolithically integrated thereon.

14. A non-volatile memory according to claim 12, wherein said at least one insulation stripe comprises two insulation stripes in reciprocal spaced relation.

15. A non-volatile memory according to claim 13, further comprising a plurality of reference cells between said two insulation stripes.

16. A non-volatile memory according to claim 12, wherein said at least one insulation stripe comprises silicon oxide.

17. A non-volatile memory according to claim 12, wherein said plurality of memory cells are configured so that the memory matrix architecture comprises a NOR-type architecture.

18. A non-volatile memory according to claim 1, further comprising a row decoding circuit having a number of levels based upon a number of rows to select.

19. A non-volatile memory according to claim 18, wherein said row decoding circuit further comprises a selection switch being driven by an ATD signal associated with said row decoding circuit.

20. A non-volatile memory according to claim 18, wherein said row decoding circuit comprises a plurality of N-channel pass-transistors which are driven on each level by respective signals derived from an ATD signal.

21. A non-volatile memory according to claim 20, further comprising a cascade connected logic circuit, and wherein the respective signals are obtained by the ATD signal downstream of said cascade connected logic circuit.

22. A non-volatile memory according to claim 12, further comprising at least one selection pass-transistor, and wherein each column of said plurality of memory cells is head of a selection pass-transistor, and the columns of each matrix block are head of a pass-transistor for selecting a memory block.

23. A non-volatile memory according to claim 12, wherein columns of said plurality of memory cells comprises a conductive stripe in contact with said source or drain regions every 16 rows.

24. A non-volatile memory according to claim 12, wherein said plurality of memory cells are configured so that the non-volatile memory is at least one of a EPROM and a flash EPROM.

25. A method for selecting a memory cell within a non-volatile memory comprising a semiconductor substrate, row and column decoding circuits on the semiconductor substrate, a plurality of memory cells on the semiconductor substrate organized into matrix blocks placed on rows and columns of the row and column decoding circuits, each memory cell comprising a transistor comprising a source region and a drain region that are interchangeable and are organized on word lines and bit lines within a matrix block, and at least one insulation stripe on the semiconductor substrate between adjacent matrix blocks, and the at least one insulation stripe being parallel to the column, the method comprising:

connecting the respective bit line of the selected memory cell to a corresponding column decoding circuit; and simultaneously connecting an adjacent bit line to a reference potential so that the respective bit line becomes the drain region of the selected memory cell while the adjacent bit line becomes the source region of the selected memory cell.

26. A method according to claim 25, wherein the semiconductor substrate comprises a virtual ground monolithically integrated thereon.

27. A method according to claim 25, wherein the at least one insulation stripe comprises two insulation stripes in reciprocal spaced relation.

28. A method according to claim 27, wherein the non-volatile memory further comprises a plurality of reference cells between the two insulation stripes.

29. A method according to claim 25, wherein the at least one insulation stripe comprises silicon oxide.

30. A method according to claim 25, wherein the plurality of memory cells are configured so that the memory matrix architecture comprises a NOR-type architecture.

31. A method according to claim 25, wherein the non-volatile memory further comprises a row decoding circuit having a number of levels based upon a number of rows to select.

32. A method according to claim 31, wherein the row decoding circuit further comprises a selection switch being driven by an ATD signal associated with the row decoding circuit.

33. A method according to claim 31, wherein the row decoding circuit comprises a plurality of N-channel pass-transistors which are driven on each level by respective signals derived from an ATD signal.

34. A method according to claim 33, wherein the non-volatile memory further comprises a cascade connected logic circuit, and wherein the respective signals are obtained by the ATD signal downstream of the cascade connected logic circuit.

35. A method according to claim 25, wherein columns of the plurality of memory cells comprises a conductive stripe in contact with the source or drain regions every 16 rows.

36. A method memory according to claim 25, wherein the plurality of memory cells are configured so that the non-volatile memory is at least one of a EPROM and a flash EPROM.

\* \* \* \* \*